United States Patent

Hurwitt

[11] Patent Number: 5,223,108
[45] Date of Patent: Jun. 29, 1993

[54] EXTENDED LIFETIME COLLIMATOR

[75] Inventor: Steven Hurwitt, Park Ridge, N.J.

[73] Assignee: Materials Research Corporation, Orangeburg, N.Y.

[21] Appl. No.: 816,030

[22] Filed: Dec. 30, 1991

[51] Int. Cl.⁵ .............................................. C23C 14/34
[52] U.S. Cl. ........................... 204/192.12; 204/298.11
[58] Field of Search ...................... 204/192.12, 298.11

[56] References Cited

U.S. PATENT DOCUMENTS

| | | | |
|---|---|---|---|
| 3,483,114 | 12/1969 | Sapoff et al. | 204/298 |
| 3,864,239 | 2/1975 | Fletcher et al. | 204/298.11 X |
| 3,932,232 | 1/1976 | Labuda et al. | 204/192.32 |
| 4,322,277 | 3/1982 | Opresko | 204/192 R |
| 4,508,612 | 4/1985 | Blackwell et al. | 204/298 |
| 4,661,203 | 4/1987 | Smith et al. | 156/643 |
| 4,704,306 | 11/1987 | Nakamura | 204/298.11 X |
| 4,724,060 | 2/1988 | Sakata et al. | 204/298 |
| 4,824,544 | 4/1989 | Mikalesen et al. | 204/298 |
| 4,830,723 | 5/1989 | Galvagni et al. | 204/298.11 X |

FOREIGN PATENT DOCUMENTS

| | | | |
|---|---|---|---|
| 0738393 | 7/1966 | Canada | 204/298.11 |
| 2739058 | 3/1979 | Fed. Rep. of Germany | 204/298.11 |
| 02153337 | 11/1984 | Fed. Rep. of Germany | 204/298.11 |
| 58-67016 | 4/1983 | Japan . | |
| 0220912 | 12/1984 | Japan | 204/298.11 |
| 61-75514 | 4/1986 | Japan . | |
| 61-243167 | 10/1986 | Japan . | |
| 62-7855 | 1/1987 | Japan . | |
| 62-17173 | 1/1987 | Japan . | |
| 63-176470 | 7/1988 | Japan . | |
| 63-310965 | 12/1988 | Japan . | |

Primary Examiner—Nam X. Nguyen
Attorney, Agent, or Firm—Wood, Herron & Evans

[57] ABSTRACT

An improved, extended lifetime collimator for cathode sputtering has a plurality of passages which taper longitudinally from a target side of the collimator to a wafer side of the collimator. This longitudinal tapering reduces the adverse effects on collimator useful life and wafer deposition rate which are generally caused by the accumulation of sputtered particles on exposed surfaces on the target side of the collimator. Compared to prior collimators, this collimator may be used to sputter coat a greater number of wafers before replacement or cleaning is necessary, thereby enhancing throughput capability.

13 Claims, 2 Drawing Sheets

EXTENDED LIFETIME COLLIMATOR

FIELD OF THE INVENTION

This invention relates to a collimator for use in cathode sputtering. More particularly, this invention relates to an extended lifetime collimator which enhances throughput capability in the sputter coating of wafers.

BACKGROUND OF THE INVENTION

In cathode sputtering, particles are sputtered from a target and deposited onto a wafer mounted opposite the target. While the aggregate travel path of all the sputtered particles is generally direct, i.e., perpendicular from a planar target to a planar surface of an oppositely mounted wafer, a substantial number of particles travel on flight paths which are non-perpendicular. These sputtered particles traversing angled flight paths may adversely affect wafer coverage.

For example, instead of contacting and completely covering the bottom surfaces of vias or other features of a wafer, as would occur with sputtered particles taking perpendicular flight paths, sputtered particles traversing non-perpendicular angles are much more likely to deposit and accumulate on the side walls of features. The accumulation of sputtered material on the side walls of a feature prematurely closes off access to the bottom surface of the feature, before the bottom surface is entirely coated. As a result, unfilled voids are produced in the feature. This undesired closing off of access to the bottom surface of a feature is referred to as "necking" or overhang.

As shown in U.S. Pat. No. 4,724,060, it is known to position a collimator between a target and a wafer to intercept sputtered particles which traverse undesired angled flight paths toward the wafer. By intercepting particles which vary from a perpendicular flight path by more than a predetermined angle, more effective filling of the features of a wafer is assured. In short, a collimator provides control over the directionality of the flight paths traversed by sputtered particles which ultimately deposit on a wafer.

A typical collimator is grid-like in structure, with a plurality of substantially parallel passages. In cross section, the passages may be rectangular, circular, hexagonal, octagonal or any one of a number of other shapes. The parallel passages permit sputtered particles to travel therethrough in a direct, perpendicular flight path from the target to the wafer. Sputtered particles which traverse flight paths oriented at angles which vary only slightly from perpendicular will also pass through the passages Sputtered particles which traverse flight paths oriented at angles which vary substantially from perpendicular will be intercepted by the collimator.

The shapes of the passages of the collimator, sometimes referred to as the "unit cells", determine the cutoff angle, or critical angle, of flight whereby sputtered particles are either intercepted or permitted to pass therethrough. More particularly, the aspect ratio, i.e., the ratio of cell length to cell width, of each unit cell determines the critical angle. Cell length refers to the dimension measured from the target to the wafer along the shortest path. Cell width is measured perpendicular to cell length, at the greatest width along the length of the cell.

Assuming a generally planar target, a generally planar wafer and a generally planar collimator located therebetween, a direct path from the target through the collimator to the wafer will be referred to as a perpendicular, or 90° flight path. All sputtered particles which traverse a 90° flight path will pass through the collimator, except for a relatively small number which will collide with the leading edges of the collimator walls. For sputtered particles traversing a flight path at an angle other than 90°, those traversing flight paths which vary from 90° by more than the critical angle will be intercepted by the collimator.

For a collimator having unit cells with an aspect ratio of one, i.e., a length of one unit measured along the 90° flight path and a width of one unit, the critical angle is 45°. Sputtered particles traversing a flight path which varies from 90° by more than 45°, i.e., a flight path of less than 45° or greater than 135° with respect to the target surface, will be intercepted by the collimator. Sputtered particles which traverse a flight path greater than 45° and less than 135°, again with respect to the surface of the target, will not be intercepted. As the aspect ratio of the unit cells of a collimator increases, the critical angle decreases and more of the particles traversing angled flight paths are intercepted.

For a collimator with unit cells that are circular in cross-sectional shape, the aspect ratio, and hence the critical angle, is the same regardless of the angular orientation of the collimator with respect to the target and the wafer. This is true because the width of the unit cells is always equal to the diameter. However, if the unit cells are rectangular in cross-sectional shape, or perhaps hexagonal, the aspect ratio measured from corner to corner will differ from the aspect ratio measured between parallel surfaces.

In the context of this application, the aspect ratio of a unit cell which is non-circular in cross-section is considered to be the lowest possible value, i.e., the greatest possible width along the length of the unit cell. This means that the critical angle of a unit cell is the greatest possible angle of variation in flight path from 90° which a sputtered particle may traverse and still pass through the collimator. For example, for a unit cell which is rectangular in cross-section and uniform in transverse cross sectional shape along its length, the width dimension used to measure the aspect ratio will be the corner to corner dimension, thereby providing the lowest possible aspect ratio and the greatest possible critical angle of flight a sputtered particle may traverse and still pass through this unit cell.

During sputtering, intercepted particles continuously accumulate on the exposed surfaces of the walls which define the unit cells of the collimator. This accumulation reduces the effective open area of the unit cells. In this application, the term effective open area with respect to a unit cell refers to the smallest transverse cross sectional surface area of open space through the unit cell along its entire length. To deposit on the wafer, a sputtered particle must pass through the effective open area of one of the unit cells of the collimator.

Because the lengths of the unit cells do not change, the accumulation of intercepted particles increases the aspect ratio and decreases the critical angles of the unit cells. Therefore, of those sputtered particles traversing flight paths which are not 90°, the relative proportion of those that are intercepted will increase with respect to those that pass through, as more accumulation occurs. Moreover, this increase in the proportion of particles which are intercepted is continuous during sputtering, because of the continuous decrease in effective open area caused by accumulation. This effect is further compounded by unit cell shapes which are non-circular, because the rate of accumulation relates, to some degree, on the narrowest width of the unit cells.

The continuous reduction in the effective open area of the unit cells also has another effect. Of the sputtered particles which traverse 90° flight paths, the relative proportion of those that pass through the collimator will also decrease with respect to those that are intercepted. This is due to the decrease in open area compared to blocked or impeded area along the length of a passage through the collimator.

Thus, particle accumulation causes effective open area reduction in the unit cells, and this reduction has two adverse effects. Both of these effects are made more acute by the fact that the greatest concentration of intercepted particle accumulation occurs adjacent the target side, or entrance, to the unit cells. The rate at which unit cell effective open area decreases is relatively high, and it is continuous.

As a result of both of these effects, the deposition rate of sputtered particles onto the wafer eventually decreases to such a low value that further use is ineffective, and the collimator must be replaced or removed and cleaned. Replacement and/or cleaning of a collimator requires shutting down the wafer processing apparatus and breaking the vacuum to the chamber in which the target and the wafer are housed. Every maintenance-required shut down and restart of a wafer processing apparatus represents lost time in wafer processing, or reduced wafer throughput.

Presently, typical collimators must be replaced after the sputter coating of about 300 wafers. This number is considered by applicant to be too low, or, in another manner of reference, the frequency of collimator replacement and/or cleaning is considered too high to achieve desired throughput capability.

It is an object of this invention to provide a collimator with an extended lifetime compared to prior collimators, thereby to increase the number of wafers which may be sputter coated prior to replacement and/or cleaning of the collimator.

It is another object of the invention to provide an extended lifetime collimator which enhances throughput capability in the sputter coating of wafers.

SUMMARY OF THE INVENTION

This invention contemplates a collimator for sputter coating wherein the unit cells of the collimator taper longitudinally in the direction of the wafer.

With unit cells that decrease in width from an entrance at the target side to an exit at the wafer side, intercepted particles still accumulate along the exposed surfaces of the unit cells, but the effects of this accumulation are reduced. Compared to prior collimators, this tapered collimator has unit cells with effective open areas which do not decrease immediately and continuously throughout sputtering, and the rate of change of the aspect ratios of the unit cells is lower.

As a result, the useful life of this collimator is effectively extended beyond that of prior collimators. With the collimator of this invention, more wafers may be sputter coated prior to replacement and/or cleaning. Preliminary studies indicate that this improved, extended lifetime collimator may ultimately reduce the frequency of required replacement and/or cleaning to about every 1000 to 3000 wafers.

According to a preferred embodiment of the invention, a collimator with longitudinally tapered unit cells is of one piece construction. At each transverse cross section, the unit cells are circular in shape. In longitudinal cross section, the unit cells are trapezoidal in shape. Thus, the longitudinal taper from the target side to the wafer side results in unit cells with an overall frustoconical volume. However, other cross sectional shapes would also be suitable, depending upon the arrangement of the features on the wafer to be coated. In one configuration, the unit cells have an entrance diameter to exit diameter ratio of about 6:5 and an angle of taper which is preferably about 6°. The initial effective open area of each unit cell is determined by the radius at the wafer end of the collimator.

In an alternative embodiment of the invention, the collimator is made of plurality of parallel plates mounted in parallel orientation between the target and the wafer. Each plate has a plurality of holes. The holes decrease in diameter from the target to the wafer. Each passage is defined by the aligned holes of the parallel plates. If the holes of the plates have straight side walls, the decreasing diameter of the holes in the direction of the wafer produces passages which are tapered in a stepped manner.

Compared to the single piece construction, this embodiment is easier and less expensive to manufacture and to clean. If desired, the side walls of the holes may also be tapered in the direction of the wafer.

These and other features of the invention will become readily understood in view of the following detailed description.

DETAILED DESCRIPTION OF THE DRAWINGS

Figure 1:
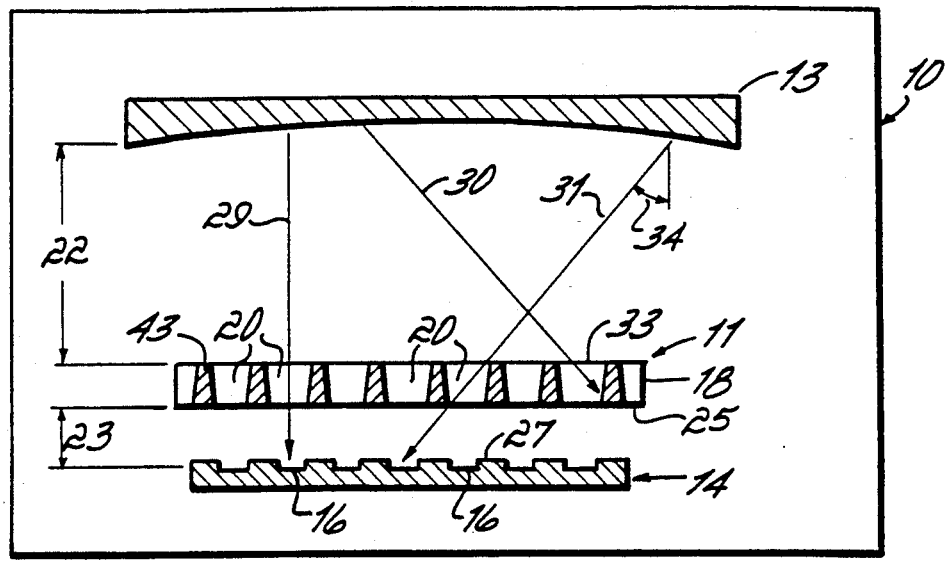
FIG. 1 is a schematic which depicts, in cross-section, a sputtering chamber equipped with an extended lifetime collimator in accordance with a preferred embodiment of the invention.

FIG. 1 shows a sputtering chamber 10 equipped with the collimator 11 in accordance with a preferred embodiment of the invention. The collimator 11 is located between a substantially planar target 13 and a wafer 14. The wafer 14 includes a plurality of features 16 which are to be filled with sputtered particles deposited onto the wafer 14 during sputter coating. The collimator 11 is preferably machined out of a machinable metal, such as aluminum, copper, stainless steel or titanium, though other materials may also be suitable. The particular material used will depend upon the material being sputtered, and the respective adherence characteristics of the two materials.

The collimator 11 includes a flat member 18 with a plurality of substantially parallel passages 20 machined therethrough. For a target 13 of either 10" or 12" diameter, the distance between the target 13 and the wafer 14 is preferably about 3.9", although it is believed that this distance is not critical and could be increased up to about 5.0". This dimension is indicated by reference numeral 22. The collimator 11 is mounted between the target 13 and the wafer 14, but is located closer to the wafer 14. Reference numeral 23 designates the distance between a wafer end 25 of the collimator 11 and a top surface 27 of the wafer 14. This distance is preferably about 1.0–1.3", although this distance is also not critical and could be as high as 1.7–2.0".

Directional arrows 29, 30 and 31 depict flight paths which may be traversed by sputtered particles as they travel from the target 13 to the wafer 14. Flight path 29 is a direct, or 90° perpendicular route from the target 13 to the wafer 14, through a passage 20. Flight path 30 terminates against a surface of one of the walls which defines a passage 20 through the collimator 11. Because flight path 30 is oriented at an angle which is less than the critical angle for the collimator 11, any sputtered particle traveling along flight path 3 is intercepted by the collimator 11 and does not deposit onto wafer 14. To the contrary, a sputtered particle traveling along a flight path 31 passes unimpeded through one of the passages 20 and deposits upon wafer 14. Directional vector 31 extends from one side of a target end 33 of passage 20 through the collimator 11 to an opposite side of the same passage 20 at the wafer end 25. Thus, the angle of flight path 31 with respect to 90° is the critical angle for the respective passage 20. Reference numeral 34 shows the critical angle of flight path. For this collimator 11, with a diameter at wafer end 25 of 10 mm and a diameter at target end 33 of 12 mm, the initial critical angle is preferably 5.7°.

As noted previously, the critical angle of a passage 20 or unit cell is the maximum allowable deviation from a 90° flight path which a sputtered particle may traverse and still pass through the collimator 11. Those sputtered particles which traverse flight paths that vary from a 90° flight path by less than the critical angle will pass through the collimator 11, while those sputtered particles which traverse flight paths which vary from a 90° flight path by more than the critical angle will be intercepted.

Figure 1A:
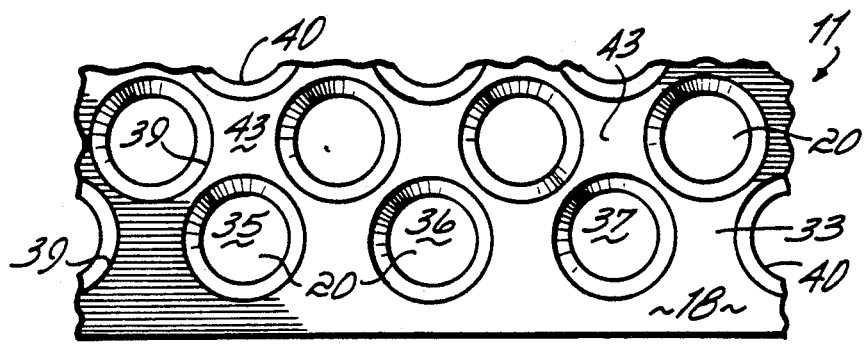
FIG. 1A is a partial top view of the collimator prior to sputtering.

FIG. 1A shows a partial top view of collimator 11. The passages 20 are circular in transverse cross section. In this embodiment, the rows of passages 20 are staggered. However, the rows and columns of the passages 20 do not need to be staggered in this manner. The orientation will depend to some extent on the location and spacings of the features on the wafer.

Figure 2:
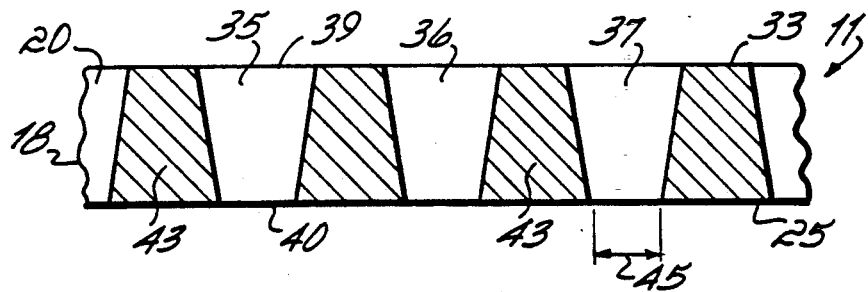
FIG. 2 is an enlarged schematic which depicts, in cross-section, several unit cells of the collimator shown in FIG. 1A, prior to sputtering.

FIG. 2 shows an enlarged cross-sectional view of some passages 20 through collimator 11, indicated as unit cells 35, 36 and 37. The unit cells are trapezoidal in longitudinal cross section, and circular in transverse cross section (FIG. 1A). The shape of each of these unit cells is defined by walls 43 which increase in thickness from the target end 33 to the wafer end 25 of the collimator 11, thereby producing a decrease in effective open area from the target end 33 to the wafer end 25. Dimensional arrow 45 designates the effective open area of unit cell 37. The effective open area is the smallest cross sectional area of open space along the length of a unit cell through which the sputtered particle may pass through to deposit on the wafer 14. For the unit cells of collimator 11, prior to sputtering, the site of the effective open area is located at the wafer end 25.

For a unit cell with a 10 mm length and 10 mm exit diameter, one preferable entrance diameter is 12 mm. These dimensions provide an angle of taper along each wall of 5.7° and an initial critical angle of 47.7°. This also provides an open area 39 at the target end 33 of 113.04 mm$^2$, and an open area 40 at the wafer end 25 of 78.50 mm$^2$, which results in a ratio of open area 39 to open area 40 of about 1.44:1.0. It is believed that this ratio may preferably range from about 1.2:1.0 to 2.0:1.0.

Figure 3:
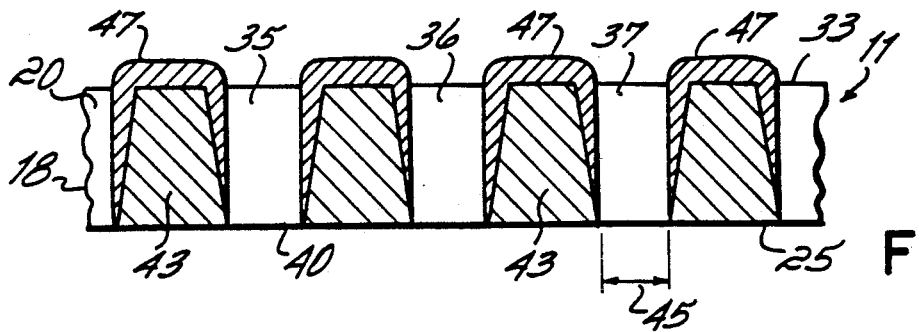
FIGS. 3 and 4 are enlarged, cross-sectional schematics, similar to FIG. 2, which depict the gradual accumulation of sputtered particles on the side walls of the unit cell during sputtering.

FIG. 3 shows the collimator 11 after a number of wafers have been sputter coated. The sputtered particles which are intercepted by the collimator 11 build up along the exposed surfaces of walls 43 and at the front end 33 of the collimator 11. The accumulation of intercepted, sputtered particles is designated by reference numeral 47. Despite significant build-up, or accumulation 47 of sputtered material on the exposed surfaces of collimator 11, the effective open area of the unit cells has not changed, as shown by numeral 45 with respect to unit cell 37.

Figure 4:
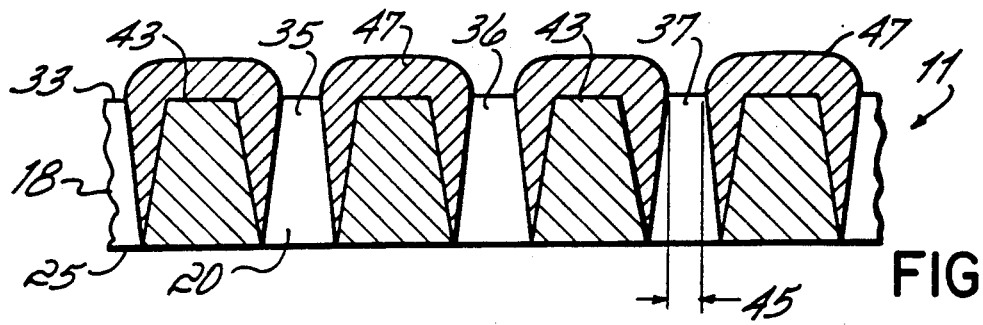

FIG. 4 shows additional accumulation 47 of sputtered material on the exposed surfaces of the walls 43 and at the front 33 of the collimator 11, similar to FIG. 3, as would occur after a significantly high number of wafers have been sputter coated. In FIG. 4, directional arrow 45 indicates that the effective open area of unit cell 37 is now located adjacent the target end 33 of the collimator 11. Because most of the accumulation 47 of intercepted, sputtered material occurs on exposed surfaces adjacent the target end 33, the site of the effective open area of the unit cells gradually moves forward during sputtering. Therefore, even though the unit cells initially have their greatest open area at target end 33, this location eventually becomes the site of narrowest open area.

Figure 5:
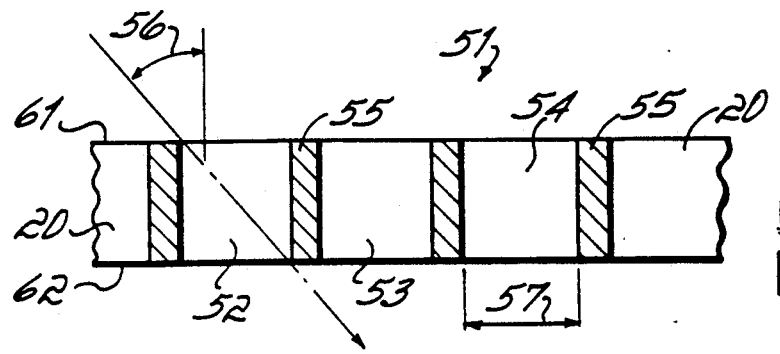
FIG. 5 is an enlarged schematic which depicts in cross-section, a prior art collimator, prior to sputtering.

In comparison, FIG. 5 shows an enlarged cross-sectional view of a portion of a prior art collimator 51. This collimator 51 has unit cells 52, 53 and 54 defined by parallel walls 55 which are perpendicular to the planar surfaces of the target 13 and the wafer 14. Directional arrow 56 indicates the critical angle of unit cells 52. Directional arrow 57 shows the effective open area of unit cell 54. Because the unit cell 54 is uniform in cross-section from a target end 61 to a wafer end 62, its effective open area is the same along its entire length.

Figure 6:
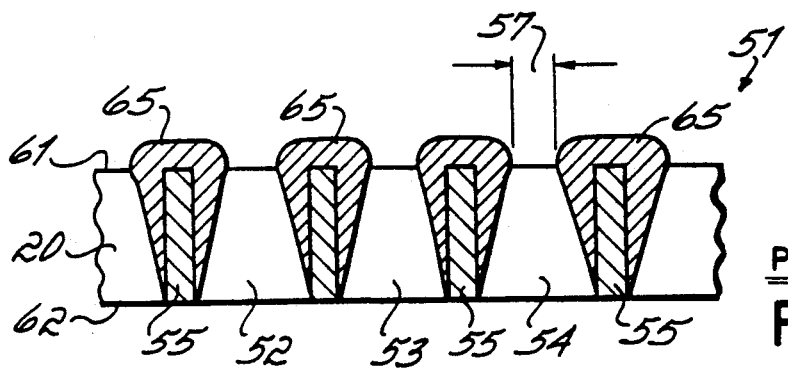
FIG. 6 is an enlarged cross-sectional schematic, similar to FIG. 5, which depicts a prior art collimator after some accumulation of sputtered particles.

FIG. 6 shows the prior art collimator 51 after a number of wafers have been sputter coated. Accumulated sputtered material is indicated by reference numeral 65. As shown in FIG. 3, the bulk of the accumulated material 65 occurs on exposed surfaces adjacent a target end 61 of the collimator 51. However, because the target end 61 is also the location of the effective open area 57, the effective open areas of the unit cells immediately decrease when sputtering commences, and the effective open areas decrease continuously throughout sputtering. For example, directional arrow 57 indicates that the effective open area of unit cell 54 is considerably less in FIG. 6 than in FIG. 5, before any sputtering.

As the effective open area of the unit cells decrease, the effect is twofold. Proportionately, fewer of the sputtered particles traveling at 90° flight paths will pass through the collimator 51, due to the smaller areas of the open passages 20 compared to non-open or impeded areas. Moreover, as sputtering progresses, fewer sputtered particles traversing angled flight paths pass through the collimator 51, due to the continuous decrease in the critical angle of the unit cells. This effect can be seen by comparing FIG. 6 with FIG. 5. Because most of the accumulated material 65 builds up adjacent target end 61 of the collimator 51, the critical angle decreases continuously and at a relatively rapid rate. Stated in another manner, the aspect ratio of the unit cells continuously increases during sputtering at a relatively high rate.

As a result of these two effects, the deposition rate of sputtered particles onto the wafer eventually slows down so much that the collimator 41 must be replaced. Because of the parallel walls 55 of the unit cells, replacement of collimator 51 will be required before replacement of the extended lifetime collimator 11 of this invention, under the same sputter rate conditions.

It is acknowledged that the thicker walls 43 of the collimator 11 of this invention represent substantially more dead space between the target 13 and the wafer 14, as compared to prior, flat walled grid-like collimators. Generally, a collimator with more dead space will intercept a greater proportion of sputtered particles, and thereby slow down the rate of wafer deposition. However, accumulated sputtered material effectively becomes dead space. Applicant has learned that the volume of collimator dead space is not as critical as the location of the collimator dead space, which is more of a measure of the effective open area of the unit cells of the collimator and the site of the effective open area of the unit cells along their lengths. Longitudinal movement of the site of effective open area also plays an important role in deposition rate.

With the collimator 11 of this invention, the unit cells are configured such that most of the dead space is adjacent the wafer end 25. Thus, the adverse effects caused by the reduction in effective open area of the unit cells are minimized during initial and advanced stages of sputtering. Applicant's studies show that, despite an initial higher volume of dead space per unit area, as compared to prior collimators, a tapered cell collimator provides a consistent and sufficiently high deposition rate throughout its lifetime. Moreover, the tapering of the cells extends the lifetime of the collimator so that a significantly higher number of wafers may be sputter coated, thereby enhancing throughput capability.

Figure 7:
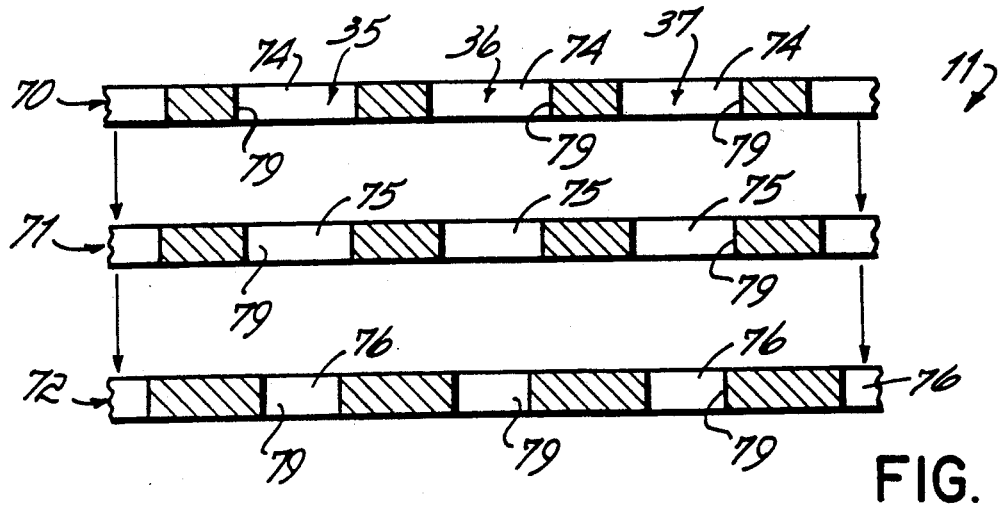
FIG. 7 is a schematic which depicts, in cross-section, an extended lifetime collimator in accordance with an alternative embodiment of the invention.

FIG. 7 shows an alternative embodiment of the invention. In this embodiment, the collimator 11 includes three or more parallel plates, which are indicated by reference numerals 70, 71 and 72. Plates 70, 71 and 72 each have a plurality of holes 74, 75 and 76, respectively, formed therein. Preferably, these holes are circular in transverse cross section. The diameter of the holes 74 of plate 70 is greater than the diameter of the holes 75 of plate 71. Similarly, the diameter of the holes 75 of plate 71 is greater than the diameter of holes 76 of plate 72. Similarly, if additional plates are used, the diameter of the holes decreases in the direction from the target 13 to the wafer 14.

When the plates are aligned, the aligned holes define the passages 20 of the collimator 11. For instance, as indicated in FIG. 7, the shape of unit cell 37 is defined by the alignment of hole 74, hole 75 and hole 76. In this configuration, in longitudinal cross section, the unit cells have a taper which is stepped. Preferably, the plates are clamped together in surface to surface contact. However, it would also be possible to locate spacers between proximate surfaces adjacent plates to provide some clearance therebetween. This clearance or void space between the plates may fill up with some of the accumulated sputtered material.

As shown in FIG. 7, the side walls 79 of the holes 74, 75 and 76 form 90° angles with respect to top and bottom surfaces of the plates. However, if desired, side walls 79 of the holes could also be angled so as to form a longitudinal taper within each of the separate holes.

It is believed that this alternative embodiment of the invention would be less expensive to produce. Moreover, if it were used, it would probably be easier to clean.

While two preferred embodiments of the invention have been described, it is to be understood that the invention is not limited thereby and that in light of the present disclosure, various other alternative embodiments will be apparent to one of ordinary skill in the art without departing from the scope of the invention. For instance, for unit cells circular in cross section, it is contemplated that the unit cell length may range from 5–20 mm and that the unit cell width may range in diameter from 5–20 mm, with the taper angle on each wall preferably ranging from above 0° to about 15°, depending on the shape of the unit cells. Accordingly, applicant intends to be bound only by the following claims.

We claim:

1. A sputter coating apparatus comprising:
   an evacuable chamber;
   a sputter target mounted in said chamber;
   a wafer mounted to said chamber opposite said target; and
   a collimator mounted between said target and said wafer, said collimator being spaced away from the wafer and said collimator having a plurality of passages which extend therethrough, each of said passages having a relatively large transverse cross sectional are entrance on a target side of the collimator and a relatively small transverse cross sectional area exit on a wafer side of the collimator, said passages tapering longitudinally from said relatively large transverse cross sectional area entrance to said relatively small transverse cross sectional area exit, the greatest transverse cross sectional area of each of the passages being smaller than the surface area of deposition on the wafer.

2. The sputter coating apparatus of claim 1 wherein said collimator is of unitary, single-piece construction.

3. The sputter coating apparatus of claim 2 wherein said collimator is formed of one component selected from the following components: aluminum, copper, stainless steel and titanium.

4. The sputter coating apparatus of claim 1 wherein said passages are frustoconical in shape, with a circular transverse cross section and a trapezoidal longitudinal cross section.

5. The sputter coating apparatus of claim 4 wherein, for each said passage, the ratio of the open area at the entrance to the open area at the exit is in the range of about 1.2:1 to 2.0:1.

6. The sputter coating apparatus of claim 1 wherein said collimator further comprises:
   at least three parallel plates aligned substantially parallel to said target and said wafer, each said plate having a plurality of throughholes and each said tapered passage defined by a plurality of aligned throughholes.

7. The sputter coating apparatus of claim 6 wherein each said throughhole is circular in cross-section.

8. The sputter coating apparatus of claim 7 wherein, for each said passage, the ratio of the open area at the entrance to the open area at the exit is in the range of about 1.2:1 to 2.0:1.

9. A sputter coating apparatus comprising:
an evacuable chamber;
a sputter target mounted in said chamber;
a water mounted in said chamber opposite said target; and
a collimator mounted between said target and said wafer, said collimator being spaced away from the wafer and said collimator having a plurality of open unit cells which permit the passage therethrough of sputtered particles from said target to said wafer, said unit cells being trapezoidal in longitudinal cross section and having a smallest effective transverse cross sectional open area at a wafer end of said collimator, the greatest transverse cross sectional open area of each of the unit cells being smaller than the surface area of deposition on the wafer.

10. A method of sputter coating a wafer comprising the steps of:
placing a collimator between a target and a wafer in a sputter coating chamber so that the collimator is spaced from both the target and the wafer, the collimator having a plurality of passages therethrough defined by internal walls, said internal walls having a lesser thickness at a target side of the collimator than at a wafer side of the collimator so that each of said passages tapers inwardly in a longitudinal direction from said target to said wafer, the greatest transverse cross sectional area of each of the passages being less than the surface area of deposition on the wafer; and
sputtering particles from said target to said water and intercepting some of said sputtered particles upon contact with said internal walls of said collimator and allowing some of said sputtered particles to pass through said tapered passages.

11. The method of claim 10 wherein said placing step further comprises:
aligning a plurality of collimator plates in substantially parallel orientation between said target and said wafer, each of said plates having a plurality of holes formed therein, each said tapered passage defined by a plurality of aligned holes.

12. A wafer processing component for use during sputter coating of a wafer mounted opposite a target in a sputtering chamber comprising:
a collimator having a plurality of passages which permit sputtered particles to pass therethrough from the target to the wafer, said passages tapering inwardly continuously in a longitudinal direction from a target side to a wafer side of the collimator, and the greatest transverse cross sectional area of each of the passages being less than the surface area of deposition on the wafer.

13. The wafer processing component of claim 12 wherein said passages are circular in transverse cross section and trapezoidal in longitudinal cross section, with the area of said circular cross-section decreasing from said target side to said wafer side.

* * * * *

UNITED STATES PATENT AND TRADEMARK OFFICE
CERTIFICATE OF CORRECTION

PATENT NO. : 5,223,108
DATED : June 29, 1993
INVENTOR(S) : Steven Hurwitt

It is certified that error appears in the above-identified patent and that said Letters Patent is hereby corrected as shown below:

Column 5, Line 27, "path 3" should read

--path 30--.

Column 7, Line 13, "collimator 41" should read

--collimator 51--.

Claim 1, Column 8, Line 32, "mounted to" should read --mounted in--.

Claim 9, Column 9, Line 10, "water" should read

--wafer--.

Claim 9, Column 10, Line 5, "water" should read

--wafer--.

Signed and Sealed this

Fourth Day of October, 1994

*Attest:*

BRUCE LEHMAN

*Attesting Officer*     *Commissioner of Patents and Trademarks*